(12) United States Patent
Zhou et al.

(10) Patent No.: US 10,277,204 B2
(45) Date of Patent: Apr. 30, 2019

(54) CIRCUITS AND METHODS FOR TRANSCEIVER SELF-INTERFERENCE CANCELLERS

(71) Applicants: Jin Zhou, New York, NY (US); Harish Krishnaswamy, New York, NY (US)

(72) Inventors: Jin Zhou, New York, NY (US); Harish Krishnaswamy, New York, NY (US)

(73) Assignee: The Trustees of Columbia University in the City of New York, New York, NY (US)

(*) Notice: Subject to any disclaimer, the term of this patent is extended or adjusted under 35 U.S.C. 154(b) by 0 days.

(21) Appl. No.: 15/515,823

(22) PCT Filed: Oct. 1, 2015

(86) PCT No.: PCT/US2015/053614
§ 371 (c)(1),
(2) Date: Mar. 30, 2017

(87) PCT Pub. No.: WO2016/054455
PCT Pub. Date: Apr. 7, 2016

(65) Prior Publication Data
US 2017/0250677 A1 Aug. 31, 2017

Related U.S. Application Data

(60) Provisional application No. 62/233,215, filed on Sep. 25, 2015, provisional application No. 62/058,575, filed on Oct. 1, 2014.

(51) Int. Cl.
*H03H 19/00* (2006.01)
*H04B 1/525* (2015.01)
(Continued)

(52) U.S. Cl.
CPC ........... *H03H 19/002* (2013.01); *H04B 1/525* (2013.01); *H04B 17/336* (2015.01);
(Continued)

(58) Field of Classification Search
CPC ......... H03H 19/002; H03H 2021/0094; H03H 11/0422; H04B 17/336; H04B 1/38
(Continued)

(56) References Cited

U.S. PATENT DOCUMENTS 6,693,971 B1 2/2004 Kowalski
8,081,946 B2 12/2011 Fudge
(Continued)

OTHER PUBLICATIONS

Aparin et al., "An Integrated LMS Adaptive Filter of TX Leakage for CDMA Receiver Front Ends", in IEEE Journal of Solid-State Circuits, vol. 41, No. 5, Apr. 2006, pp. 1171-1182.
(Continued)

*Primary Examiner* — Michael R Neff
(74) *Attorney, Agent, or Firm* — Byrne Poh LLP (57) ABSTRACT

Self-interference cancellers are provided. The self-interference cancellers can include multiple second-order, N-path $G_m$-C filters. Each filter can be configured to cancel self-interference on a channel of a desired bandwidth. Each filter can be independently controlled using a variable transmitter resistance, a variable receiver resistance, a variable baseband capacitance, a variable transconductance, and a variable time shift between local oscillators that control switches in the filter. By controlling these variables, magnitude, phase, slope of magnitude, and slope of phase of the cancellers frequency responses can be controlled for self-interference cancellation. A calibration process is also provided for configuring the canceller.

8 Claims, 9 Drawing Sheets

(51) Int. Cl.
    H04B 17/336    (2015.01)
    H04L 25/03     (2006.01)
(52) U.S. Cl.
    CPC . *H04L 25/03006* (2013.01); *H03H 2210/021* (2013.01); *H03H 2210/025* (2013.01); *H03H 2210/028* (2013.01)
(58) Field of Classification Search
    USPC ....................................................... 375/219
    See application file for complete search history.

(56) References Cited

U.S. PATENT DOCUMENTS

| 8,149,742 | B1 | 4/2012 | Sorsby |
| 8,725,067 | B2 | 5/2014 | Ahn et al. |
| 8,755,756 | B1 | 6/2014 | Zhang et al. |
| 2004/0142700 | A1 | 7/2004 | Marinier |
| 2010/0201598 | A1 | 8/2010 | Lau et al. |
| 2011/0256857 | A1 | 10/2011 | Chen et al. |
| 2012/0046004 | A1 | 2/2012 | Mirzaei et al. |
| 2013/0301487 | A1 | 11/2013 | Khandani |
| 2014/0050124 | A1 | 2/2014 | Yang et al. |

OTHER PUBLICATIONS

Avago Technologies, "ACMD-7612 Miniature UMTS Band i Duplexer Data Sheet", Technical Paper, Data Sheet, Sep. 2007, pp. 1-12.
Bharadia et al., "Full Duplex Radios", in the proceedings of the ACM SIGCOMM 2013, Hong Kong, CN, Aug. 2013, pp. 375-386.
Darvishi et al., "Widely Tunable 4th Order Switched Gm-C Band-Pass Filter Based on N-Path Filters", in IEEE Journal of Solid-State Circuits, vol. 47, No. 12, Dec. 2012, pp. 3105-3119.
Debaillie et al., "Analog/RF Solutions Enabling Compact Full-Duplex Radios", in IEEE Journal of Selected Areas of Communication, vol. 32, No. 9, Sep. 2014, pp. 1662-1673.
Dinc et al., "A 60GHz Same-Channel Full-Duplex CMOS Transceiver and Link Based on Reconfigurable Polarization-Based Antenna Cancellation", in the proceedings of the IEEE Radio Frequency Integrated Circuits Symposium, Phoenix, AZ, US, May 2015, pp. 1-4.
Dinc et al., "A T/R Antenna Pair with Polarization-Based Reconfigurable Wideband Self-Interference Cancellation for Simultaneous Transmit and Receive", in the proceedings of the IEEE International Microwave Symposium, Phoenix, AZ, US, May 2015, pp. 1-4.
Duarte et al., "Experiment-Driven Characterization of Full-Duplex Wireless Systems", in IEEE Transactions on Wireless Communications, vol. 11, No. 12, Dec. 2012, pp. 4296-4307.
Franks et al., "An Alternative Approach to the Realization of Network Transfer Functions: The N-Path Filter", in the Bell Systems Technical Journal, vol. 39, No. 5, Sep. 1960, pp. 1321-1350.
Ghaffari et al., "Tunable High-Q N-Path Band-Pass Filters: Modeling and Verification", in IEEE Journal of Solid-State Circuits, vol. 46, No. 5, Apr. 2011, pp. 998-1010.
Goel et al., "Tunable Duplexer with Passive Feed-Forward Cancellation to Improve the RX-TX Isolation", in IEEE Transactions on Circuits and Systems, vol. 62, No. 2, Feb. 2015, pp. 536-544.
Hashemi et al., "Integrated True-Time-Delay-Based Ultra-Wideband Array Processing", in IEEE Communications Magazine, vol. 46, No. 9, Sep. 2008, pp. 162-172.
International Preliminary Report on Patentability and Written Opinion dated Apr. 4, 2017 in International Application No. PCT/US2015/053614.
International Search Report and Written Opinion dated Jan. 29, 2016 in International Application No. PCT/US2015/053614.
Jain et al., "Practical, Real-Time, Full Duplex Wireless", in the proceedings of the 17th Annual International Conference on Mobile Computing and Networking, Las Vegas, NV, US, Sep. 2011, pp. 301-312.
Jayasuriya et al., "A Baseband Technique for Automated LO Leakage Suppression Achieving < -80dBm in Wideband Passive Mixer-First Receivers", in the proceedings of the Custom Integrated Circuits Conference, San Jose, CA, US, Sep. 2014, pp. 1-4.
Khatri et al., "An Active Transmitter Leakage Suppression Technique for CMOS SAW-less CDMA Receivers", in IEEE Journal of Solid-Stale Circuits, vol. 45, No. 8, Jul. 2010, pp. 1590-1601.
Khatri et al., "Distortion in Current Commutating Passive CMOS Downconversion Mixers", in IEEE Transactions on Microwave Theory and Techniques, vol. 57, No. 11, Nov. 2009, pp. 1-11.
Mahrof et al., "A Receiver with In-Band IIP3 >20dBm, Exploiting Cancelling of Opamp Finite-Gain-Induced Distortion via Negative Conductance", In the Proceedings of the IEEE RFIC Symposium, Jun. 2013, pp. 85-88.
Marasevic et al., "Resource Allocation and Rate Gains in Practical Full-Duplex Systems", in the proceedings of the ACM SIGMETRICS, Portland, OR, US, Jun. 2015, pp. 1-16.
Mirzaei et al., "A 65nm CMOS Quad-Band Saw-Less Receiver SOC for GSM/GPRS/Edge", in the IEEE Journal of Solid-State Circuits, vol. 46, No. 4, Apr. 2011, pp. 950-964.
Murphy et al., "A Blocker-Tolerant, Noise-Cancelling Receiver Suitable for Wideband Wireless Applications", IEEE Journal of Solid-State Circuits, vol. 47, No. 12, Dec. 2012, pp. 1-21.
Omer et al., "A PA-Noise Cancellation Technique for Next Generation Highly Integrated RF Front-Ends", in the proceedings of the IEEE Radio Frequency Integrated Circuits Symposium, Montreal, QC, CA, Jun. 2012, pp. 1-4.
Reiskarimian et al., "Analysis and Design of Two-Port N-Path Bandpass Filters With Embedded Phase Shifting", in IEEE Transactions on Circuits and Systems, vol. 63, No. 8, Aug. 2016, pp. 1-5.
Roessler el al., "LTE-Advanced (3GPP Rel. 12) Technology Introduction", White Paper, Rohde & Schwarz, 2015, pp. 1-60.
Sabharwal et al., In-Band Full-Duplex Wireless: Challenges and Opportunities, in IEEE Journal on Selected Areas in Communications, vol. 32, No. 9, Sep. 2014, pp. 1637-1652.
Sahai et al., "On the Impact of Phase Noise on Active Cancellation in Wireless Full-Duplex", in IEEE Transactions on Vehicular Technology, vol. 62, No. 9, Nov. 2013, pp. 4494-4510.
Soer et al., "Unified Frequency-Domain Analysis of Switched-Series-Passive Mixers and Samplers", in IEEE Transactions on Circuits and Systems, vol. 57, No. 10, Oct. 2010, pp. 2618-2631.
Su et al., "Wideband TX Leakage Cancellation Using Adaptive Delay Filter at RF Frequencies", in the proceedings of the IET Irish Signals and Systems Conference, Limerick, IE, Jun. 2014, pp. 1-6.
Van den Broek et al., "A Self-Interference Cancelling Receiver for In-Band Full-Duplex Wireless with Low Distortion under Cancellation of Strong TX Leakage", in the proceedings of the IEEE Solid-State Circuits Conference, San Francisco, CA, US, Feb. 2015, pp. 1-8.
Yang et al., "A Widely Tunable Active Duplexing Transceiver with Same-Channel Concurrent RX/TX and 30db RX/TX Isolation", in the proceedings of the IEEE Radio Frequency Integrated Circuits Symposium, Tampa, FL, US, Jun. 2014, pp. 321-324.
Zhang, Tong, "An Integrated CMOS Passive Transmitter Leakage Suppression Technique for FDD Radios", Thesis Paper, University of Washington, Jun. 2014, pp. 1-77.
Zhou et al., "A Blocker-Resilient Wideband Receiver with Low-Noise Active Two-Point Cancellation of >0dBm TX Leakage and TX Noise in RX Band for FDD/Co-Existence", in the proceedings of the IEEE Solid-State Circuits Conference, San Francisco, CA, US, Feb. 2014, pp. 1-3.
Zhou et al., "Low-Noise Active Cancellation of Transmitter Leakage and Transmitter Noise in Broadband Wireless Receivers for FDD/Co-Existence", in IEEE Journal of Solid-State Circuits, vol. 49, No. 12, Dec. 2014, pp. 3046-3062.
Zhou et al., "Reconfigurable Receiver with >20MHz Bandwidth Self-Interference Cancellation Suitable for FDD, Co-Existence and Full-Duplex Applications", in the proceedings of the IEEE Solid-Stale Circuits Conference, San Francisco, CA, US, Feb. 2015, pp. 1-3.
Supplemental European Search Report dated May 16, 2018 in European Patent Application No. 15847787.7.
Extended European Search Report dated Sep. 21, 2018 in EP Patent Application No. 15847787.7.

CIRCUITS AND METHODS FOR TRANSCEIVER SELF-INTERFERENCE CANCELLERS

CROSS-REFERENCE TO RELATED APPLICATIONS

This application claims the benefit of U.S. Provisional Patent Application No. 62/058,575, filed Oct. 1, 2014, and U.S. Provisional Patent Application No. 62/233,215, filed Sep. 25, 2015, each of which is hereby incorporated by reference herein in its entirety.

STATEMENT REGARDING GOVERNMENT FUNDED RESEARCH

This invention was made with government support under contract HR0011-12-1-0006 awarded by Defense Advanced Research Projects Agency. The government has certain rights in the invention.

BACKGROUND

In many wireless devices, closely located transmitters and receivers operate simultaneously in slightly separate frequency bands or in the same frequency band/channel. For example, in multi-band frequency division duplexing (FDD) transceivers, a transmitter in the transceiver operates in different, but possibly close frequency band to a receiver in the transmitter. Interference from the transmit frequency can affect the performance of the receiver even though it is operating at a different frequency band. As the frequencies of the transmitter and receiver get closer together, this problem can get worse.

As another example, in full-duplex wireless transceivers, the transmitter and the receiver of the transceiver transmit and receive on the same frequencies at the same time, but utilize self-interference cancellation to enable communication.

Existing techniques for cancelling interference between closely operating transmitters and receivers have many deficiencies.

Accordingly, new circuits and methods for transceiver self-interference cancellers are desirable.

SUMMARY

Circuits and methods for self-interference cancellers are provided.

In some embodiments, circuits for a transceiver self-interference canceller are provided, the circuits comprising: a plurality of RF high-Q bandpass filters that each emulate the magnitude, phase, magnitude slope, and phase slope responses of antenna isolation in different sub-frequency bands.

In some embodiments, each of the plurality of RF high-Q bandpass filters comprise: a first variable resistance having a control input, a first side coupled to a transmitter signal, and a second side; a plurality of first switches, each having a control input, a first side coupled to the second side of the variable resistor, and a second side; a plurality of first variable capacitances, each having a control input, a first side connected to ground, and a second side connected to a unique one of the second sides of the plurality of first switches; a plurality of second switches, each having a control input, a first side coupled to a unique one of the second sides of the plurality of first variable capacitances, and a second side; a second variable resistance having a control input, a first side connected to ground, and a second side coupled to each of the second sides of the plurality of second switches; a second variable capacitance having a control input, a first side connected to the each of the second sides of the plurality of second switches, and a second side coupled to a receiver signal; a plurality of variable transconductors, each having an input connected to a unique one of the second sides of the plurality of first variable capacitances, and an output connected to a unique one of the second sides of the plurality of first variable capacitances, wherein for each of the plurality of variable transconductors, the input of the variable transconductor is not connected to the output of the variable transconductor; and a first local oscillator having a plurality of outputs each connected to a unique one of the control inputs of the plurality of first switches, wherein the first local oscillator turns on one of the plurality of first switches at a time; and a second local oscillator having a plurality of outputs each connected to a unique one of the control inputs of the plurality of second switches, wherein the second local oscillator turns on one of the plurality of second switches at a time, and wherein the plurality of outputs of the second local oscillator are shifted in time by a time shift amount from the plurality of outputs of the first local oscillator.

In some embodiments, methods for calibrating a self-interference canceller are provided, the methods comprising: measuring $H_{SI}$ with a canceller off; measuring $H_{SIC}$ with the canceller on; determining whether the magnitude and the slope of the $H_{SI}$ and the $H_{SIC}$ match; when it is determined that the magnitude and the slope of the $H_{SI}$ and the $H_{SIC}$ do not match, adjusting a relative resistance, a capacitance, or a transconductance in the canceller; adjust phase and magnitude of $H_{SIC}$; and calculate group delay.

DETAILED DESCRIPTION

In accordance with some embodiments, circuits and methods for transceiver self-interference cancellers are provided.

Figure 1:
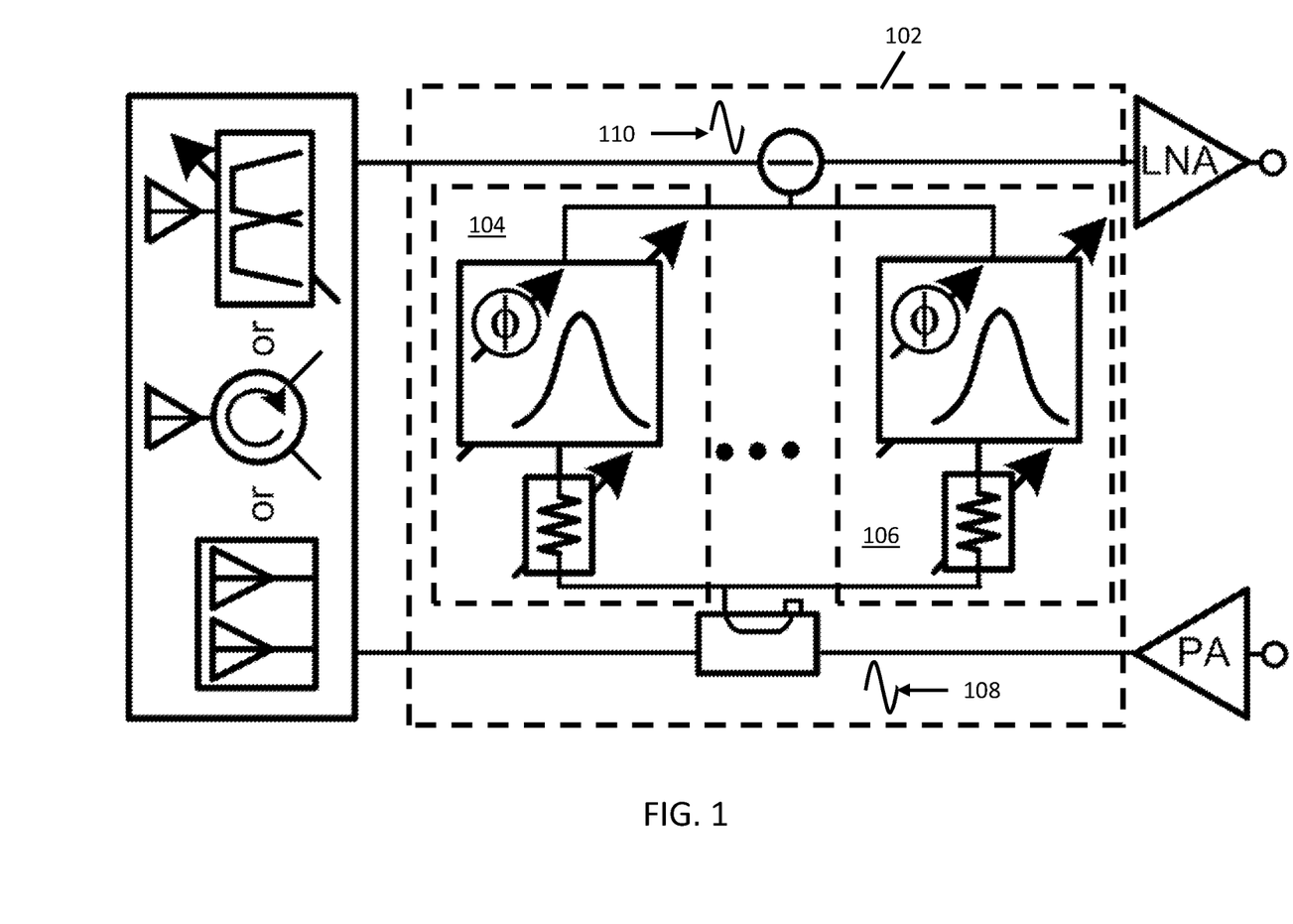
FIG. 1 is a schematic of an example of a portion of a transceiver include a self-interference canceller in accordance with some embodiments.

As shown in FIG. 1, in accordance with some embodiments, a transceiver self-interference canceller 102 can include a plurality of second-order bandpass filters 104 and 106 that, in response to a received transmitter self-interference 108, each provide a cancellation signal that is a scaled version of a transmitted transmitter signal 110 to provide self-interference cancellation.

In some embodiments, each second-order band pass filter in the canceller can provide a cancellation signal for a channel of a desired signal bandwidth. In doing so, each second-order band pass filter can provide an inverted signal that mimics the magnitude, the phase, the slope of the magnitude, and the slope of the phase (i.e., group delay) of the corresponding channel in the transmitter induced self-interference.

In some embodiments, each second-order bandpass filter can be realized as an N-path $G_m$-C filter with embedded variable attenuation and phase shifting. In some embodiments, each second-order band pass filter can be tunable, be reconfigurable, have a high Q, and/or have any other suitable characteristic(s).

Any suitable number of second-order band pass filters can be provided in the canceller in some embodiments. For example, in some embodiments, a transceiver self-interference canceller can include two second-order band pass filters.

In accordance with some embodiments, transceiver self-interference cancellers as described herein can be used to implement a frequency division duplex transceiver, a full duplex transceiver, and/or any other suitable transceiver.

Figure 2:
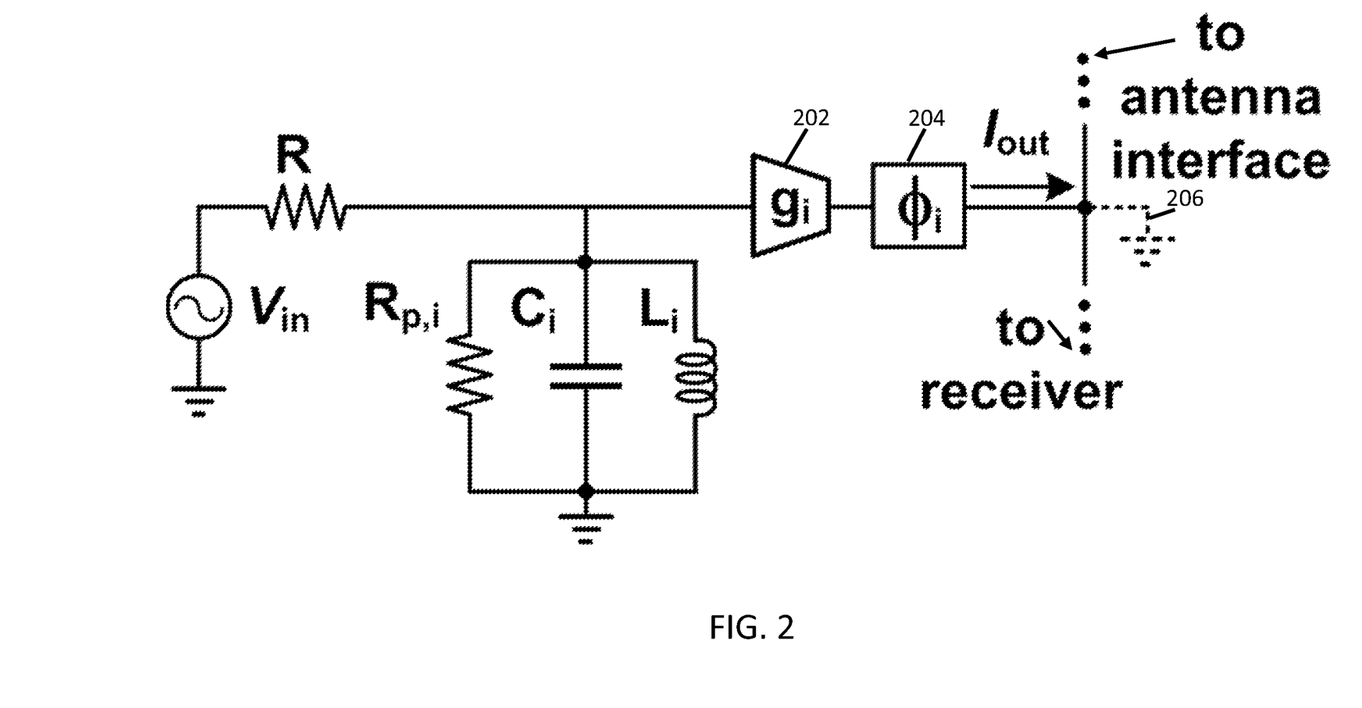
FIG. 2 is a schematic of an example of model of a second-order RLC bandpass filter in accordance with some embodiments.

The second-order bandpass filters can each be modeled using a second-order RLC bandpass filter as shown in FIG. 2, where transconductance $g_i$ 202 and phase $\phi_i$ 204 represent the magnitude and the phase control in the ith filter, in some embodiments. The short termination 206 at the canceller output represents the virtual ground created by self-interference cancellation. The transfer function of the ith path is:

$$\hat{H}_i(j\omega) = \frac{A_i \exp(-j\phi_i)}{1 - jQ_i \frac{\omega_i}{\omega}\left(1 - \frac{\omega^2}{\omega_i^2}\right)} \quad (1)$$

where:

$A_i = \frac{g_i R_{P,i}}{R_{P,i} + R}$ is the magnitude of the ith bandpass filter;

$\phi_i$ is the phase setting of the ith bandpass filter; and $Q_i = \frac{R \| R_{P,i}}{\omega_i L_i}$ represents the quality factor; and $\omega_i = 1/\sqrt{L_i C_i}$ is the center frequency.

Thus, an RF canceller with a reconfigurable second-order RF bandpass filter features four degrees of freedom ($A_i$, $\phi_i$, $Q_i$, and $\omega_i$).

Because such an RF canceller features degrees of freedom for $A_i$ and $\phi_i$, such an RF canceller enables the replication of the magnitude, the phase responses of the antenna interface isolation at a frequency point, the slope of the magnitude, and the slope of the phase. The group delay (i.e., slope of the phase) of a second-order bandpass filter is proportional to the Q of the bandpass filter, and upward/downward shifts of center frequency enable replication of positive/negative magnitude slopes (as described further in connection with FIGS. 3 and 4.

The bandpass filter parameters can be solved based on the antenna interface response ($H_{SI}/(j\omega)$) as follows:

$$A_i = \sqrt{1 + K(\omega_{SIC,i})^2} \, |H_{SI}(j\omega_{SIC,i})|; \quad (2)$$

$$\phi_i = \angle H_{SI}(j\omega_{SI,i}) + \arctan\frac{B}{|H_{SI}(j\omega_{SIC,i})|} + \pi; \quad (3)$$

$$Q_i = -\frac{B}{|H_{SI}(j\omega_{SIC,i})|} \frac{1+P}{2P} \frac{\omega_{SIC,i}}{\omega_i}; \text{ and} \quad (4)$$

$$\omega_i = \sqrt{\frac{1+P}{1-P}} \omega_{SIC,i}, \quad (5)$$

where:

$\omega_{SIC,i}$ is the cancellation frequency for the ith bandpass filter;

$$B = \frac{\left.\frac{d|H_{SI}(j\omega)|}{d\omega}\right|_{\omega=\omega_{SIC,i}}}{\left.\frac{d\angle H_{SI}(j\omega)}{d\omega}\right|_{\omega=\omega_{SIC,i}}};$$

$K(\omega_{SIC,i}) = -B/|H_{SI}(j\omega_{SIC,i})|;$ and $$P = \frac{B^2 |H_{SI}(j\omega_{SIC,i})|}{(B^2 + |H_{SI}(j\omega_{SIC,i})|^2)} \left(\left.\frac{d|H_{SI}(j\omega)|}{d\omega}\right|_{\omega=\omega_{SIC,i}} \omega_{SIC,i}\right)^{-1}.$$

Figure 3:
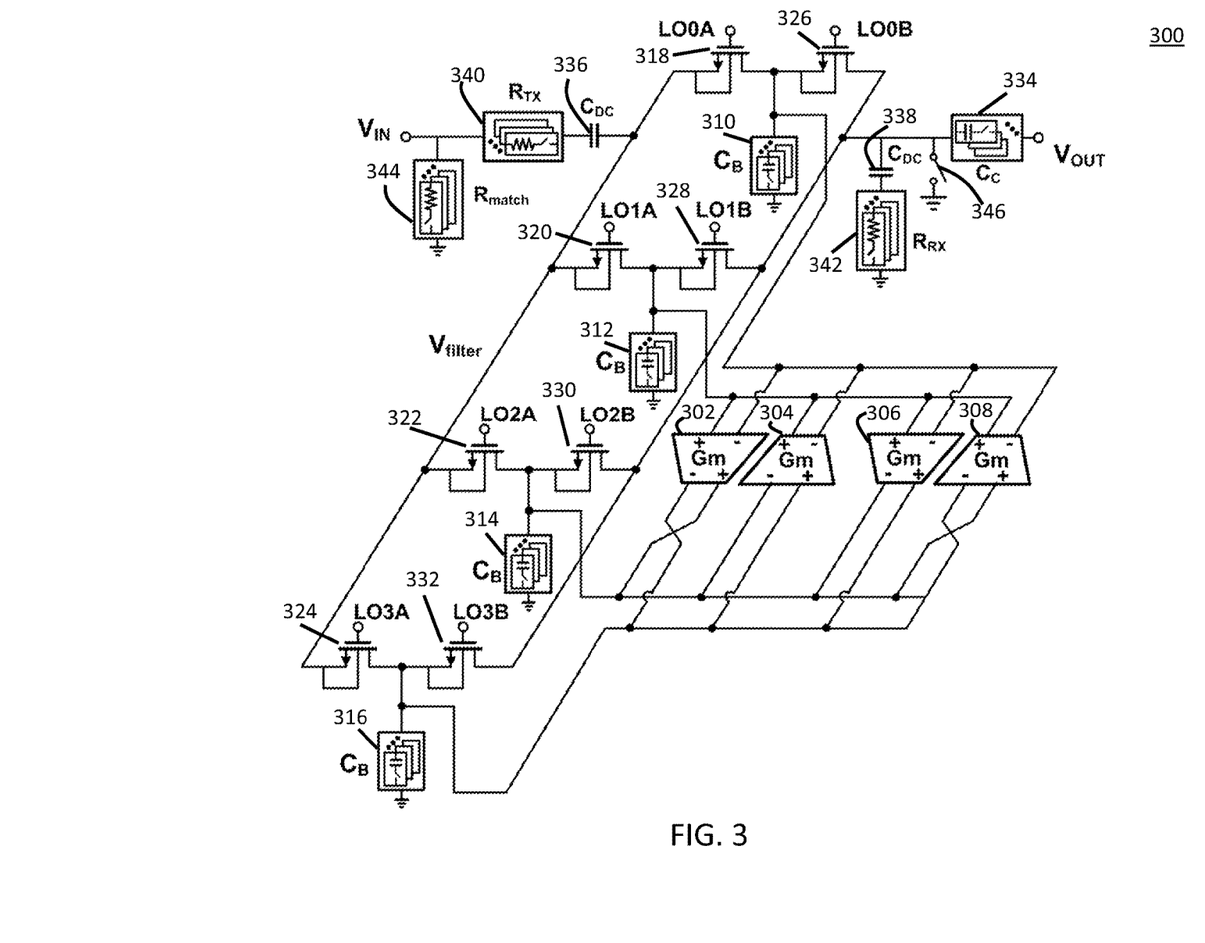
FIG. 3 is a schematic of an example of second-order $G_m$-C bandpass filter in accordance with some embodiments.

FIG. 3 illustrates an example 300 of a two-port, second-order N-path $G_m$-C filter 300 that can be used as a canceller filter in accordance with some embodiments. As shown, filter 300 includes transconductors 302, 304, 306, and 308, baseband capacitors 310, 312, 314, and 316, switches 318, 320, 322, 324, 326, 328, 330, and 332, coupling capacitor 334, DC blocking capacitors 336 and 338, resistors $R_{TX}$ 340, $R_{RX}$ 342, and $R_{match}$ 344, and switch 346.

Within filter 300, transconductors 302, 304, 306, and 308 can be turned-on or turned-off to form a clockwise connection using transconductors 302 and 304 or a counter-clockwise connection using transconductors 306 and 308.

In some embodiments, switch 346 can be used to disable the filter (by grounding its signal) for calibration purposes (as described in FIG. 9 below), for times when the filter is not needed, and/or for any other suitable reason.

Figure 4:
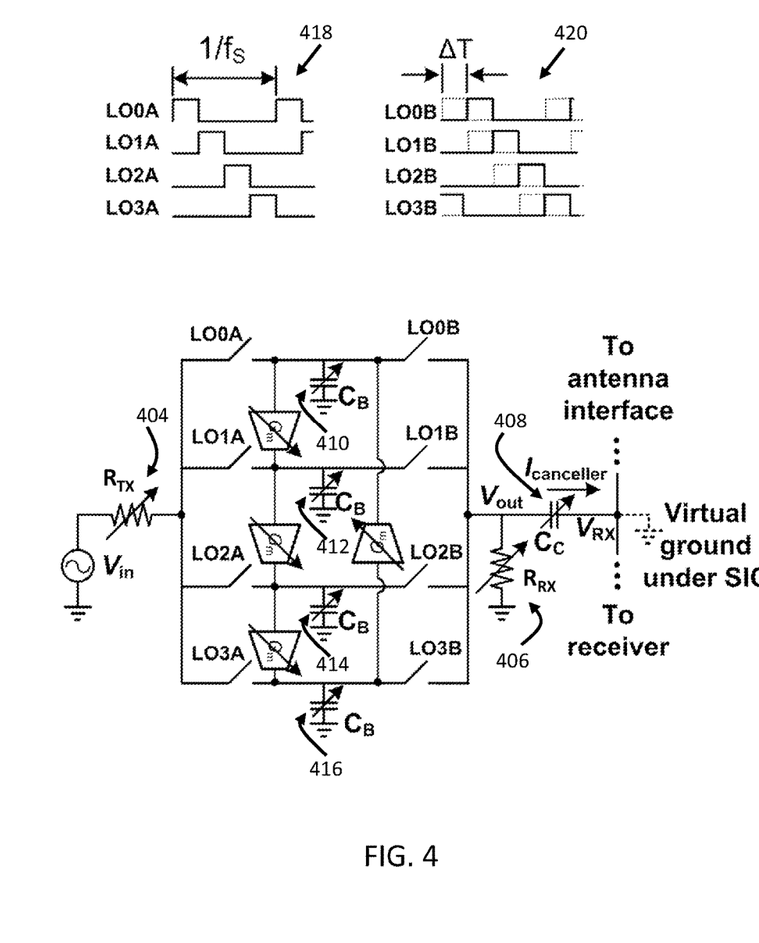
FIG. 4 is a schematic of an example of second-order $G_m$-C bandpass filter in a counterclockwise configuration in accordance with some embodiments.

FIG. 4 depicts an example of a counter-clockwise connection of two-port, second-order N-path $G_m$-C filter 300 in accordance with some embodiments.

Linear periodic time-variant (LPTV) analysis on the circuit of FIG. 4 yields:

$$Q=4\pi f_s((R_{TX}+R_{on})\|(R_{RX}+R_{on}))C_B, \quad (6)$$

where:

$R_{on}$ is the on-resistance of the N-path switches;
$f_S$ is the switching frequency; and
the loading effect of $C_C$ has been ignored.

Thus, according to equation (6), given fixed values for resistors $R_{TX}$ 404 and $R_{RX}$ 406, the quality factor Q of the filter may be reconfigured by altering the sizes of baseband capacitors $C_B$ 410, 412, 414, and 416. The effect of changing the sizes of baseband capacitors $C_B$ in some embodiments is illustrated in graphs 502 and 504 of FIG. 5.

Figure 5:
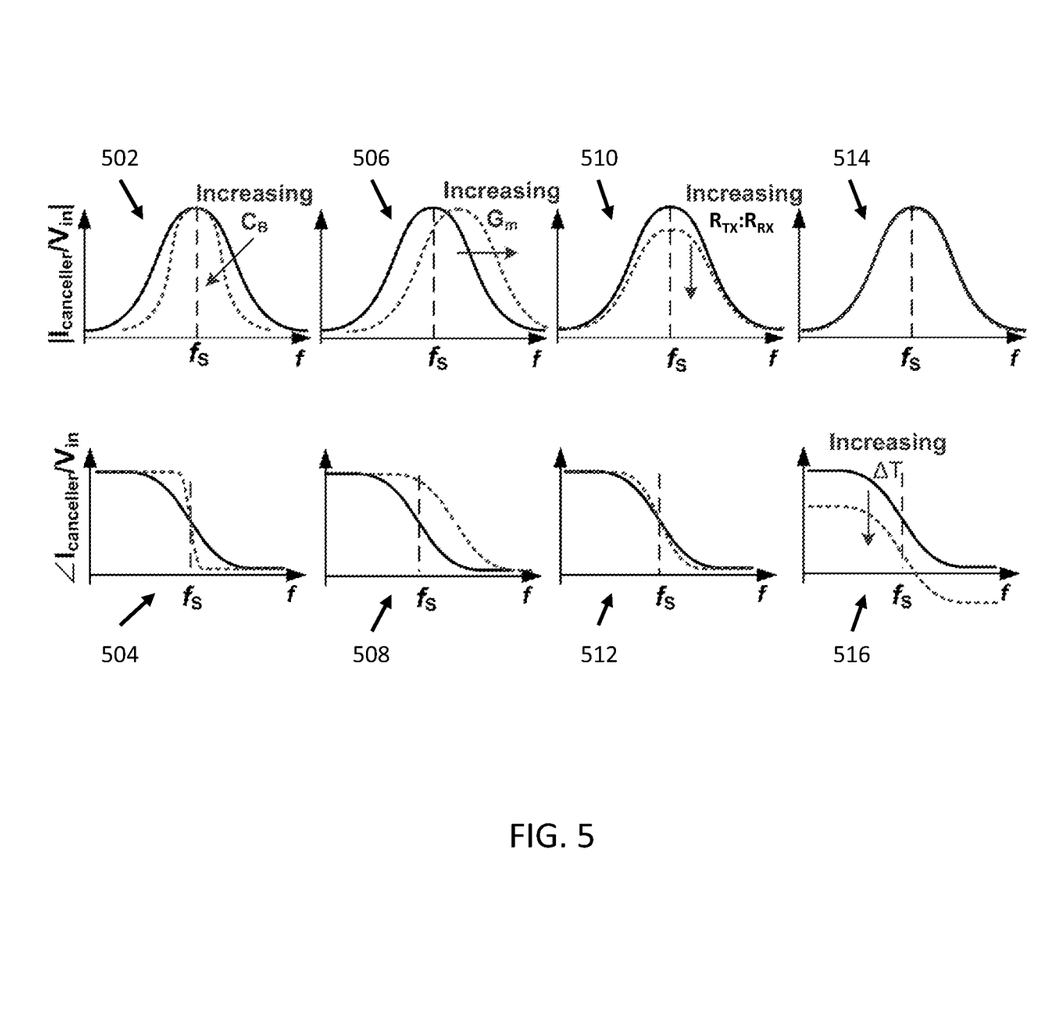
FIG. 5 is a set of graphs showing how changes to filter parameters affect filter performance in accordance with some embodiments.

Through the clockwise connection and the counter-clockwise connection of the baseband reconfigurable transconductors ($G_m$), in accordance with some embodiments, an upwards/downwards frequency offset of the center frequency with respect to the switching frequency can be obtained as shown in graphs 506 and 508 of FIG. 5. The frequency offset of the center frequency to the switching frequency is given by $$\Delta \omega = \frac{G_m}{C_B},$$

in some embodiments.

Variable attenuation (magnitude scaling) can be introduced by reconfiguring the sizes of resistors $R_{TX}$ and $R_{RX}$ relative to each other as shown in graphs 510 and 512 of FIG. 5. The magnitude response at the center frequency is:

$$|H(j\omega_S)| = \left|\frac{I_{canceller}}{V_{in}}\right|_{\omega=\omega_S} \quad (7)$$

$$R_0 = \left|\frac{V_{out}}{V_{in}}\right|_{\omega=\omega_S} \times \omega_S C_C R_0 \approx \frac{8}{\pi^2} \frac{(R_{RX}+R_{on})\omega_S C_C R_0}{R_{TX}+R_{RX}+2R_{on}}$$

wherein the loading effect of $C_C$ has been ignored when calculating $V_{out}$.

It should be noted that once cancellation is performed, $V_{RX}$ is a virtual ground. The canceller transfer function can be computed by finding the $I_{canceller}$ that flows into the virtual ground and multiplying it by the reference resistance $R_0$. Also, in the above equation for the magnitude response, the center frequency is assumed to be $\omega_S$, i.e., $G_m=0$, for simplicity.

Phase shifting can be embedded in a two-port N-path filter by phase shifting the LOs driving the switches on the output side by $\Delta T$ as shown in graphs 514 and 516 of FIG. 5.

In some embodiments, the canceller filter is weakly capacitively coupled to the receiver input. This can be accomplished using a programmable capacitor bank as capacitor $C_C$ 408. In some embodiments, this programmable capacitor bank can be sized to enable a −10 dB coupling across the operating frequency range. A weak coupling can be beneficial to minimize degradation of receiver input matching and noise factor, and to minimize any interaction of the N-path filters with each other and with the receiver.

$R_{RX}$ (which can have a nominal value of 50Ω, for example) can be sized to be smaller than $|\omega C_C|^{-1}$, so that the capacitive loading effect of $C_C$ on the N-path filter is weak. Based on the required attenuation range and equation (7), the resistance range of $R_{TX}$ can be obtained. Once $R_{TX}$ and $R_{RX}$ are set, using equation (6), the N-path filter baseband capacitance range can be determined by the required group delay or quality-factor range. Finally, the transconductance range of the baseband $G_m$ can be designed using $\Delta\omega=G_m/C_B$ based on the required frequency shift range as well as the $C_B$ capacitance range. Once $R_{TX}$ is set, $R_{match}$ (FIG. 3) can be set to provide the desired matching impedance.

Figure 6:
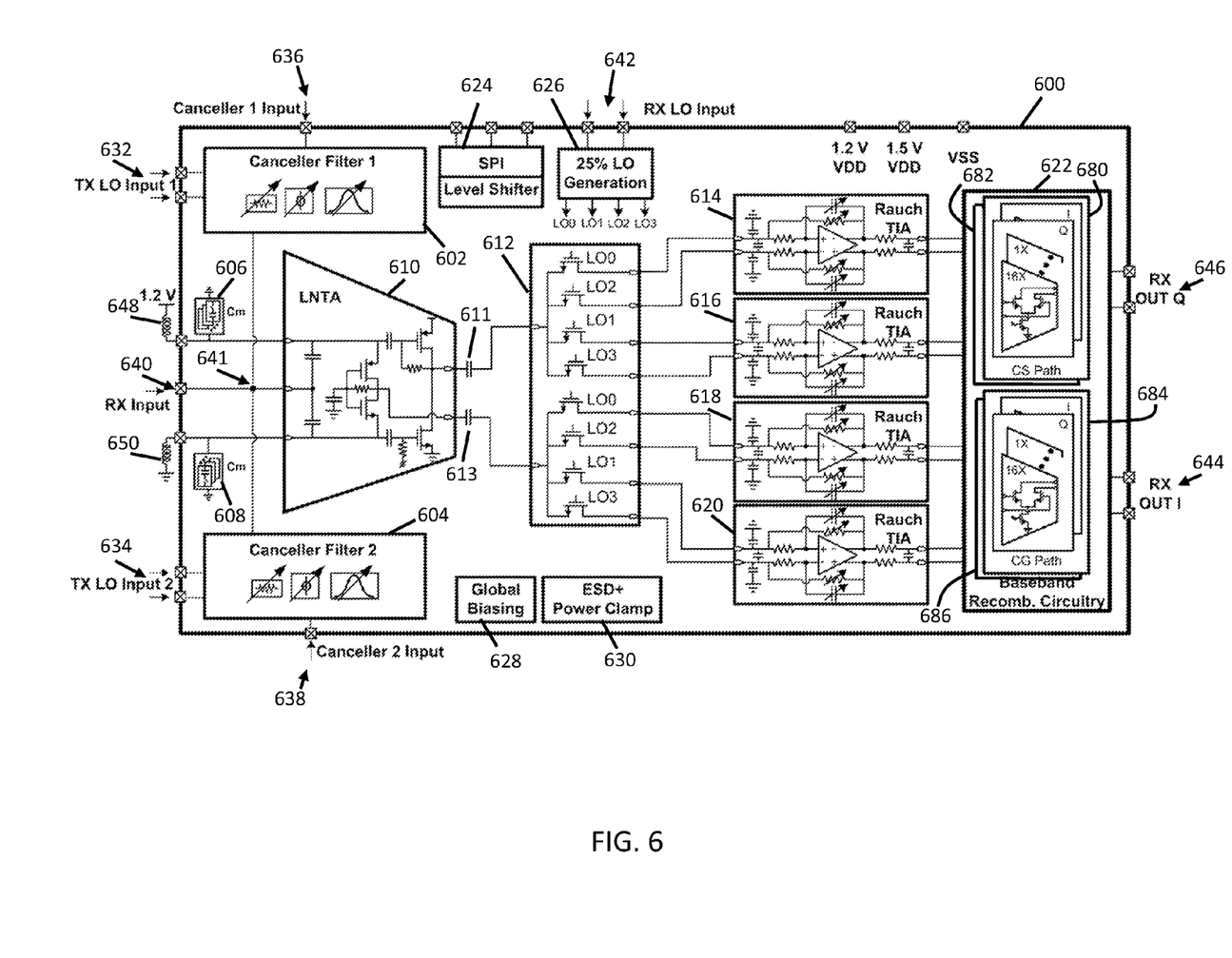
FIG. 6 is a schematic of an example of a receiver including two self-interference cancellers in accordance with some embodiments.

FIG. 6 shows an example 600 of a schematic of receiver incorporating a transceiver self-interference canceller in accordance with some embodiments. As shown, receiver 600 includes canceller filters 602 and 604, matching capacitors 606 and 608, a low noise transconductance amplifier (LNTA) 610, DC blocking capacitors 611 and 613, mixers 612, Rauch transimpedance amplifiers (TIAs) 614, 616, 618, and 620, baseband recombination circuitry 622, SPI level shifter 624, 25% LO generation circuit 626, global biasing circuit 628, and ESD and power clamp circuit 630. As shown in FIG. 6, receiver 600 also receives transmitter local oscillator inputs 632 and 634, canceller inputs 636 and 638, receiver input 640, and receiver local oscillator input 642, and outputs receiver output I 644 and receiver output Q 646.

As shown in FIG. 6, filters 602 and 604 have separate transmitter local oscillator inputs 632 and 624 and canceller inputs 636 and 638, lending flexibility in their use for cancellation of two separate transmitter signals (received at the canceller inputs) for MIMO SC-FD applications or for cancellation of transmitter noise (received at the canceller inputs) in the receiver band.

As described above, in some embodiments, canceller filters 602 and 604 are weakly capacitively coupled to receiver input 640. This can be accomplished using a programmable capacitor bank as capacitor $C_C$ 334 of FIG. 3. In some embodiments, this programmable capacitor bank can be sized to enable a −10 dB coupling across the operating frequency range. A weak coupling can be beneficial to minimize degradation of receiver input matching and noise factor, and to minimize any interaction of the N-path filters with each other and with the receiver.

In some embodiments, the input capacitance at receiver input 640 can be resonated out using a combination of wirebond inductors (not shown) and off-chip inductors 648 and 650 to supply and ground, respectively. Programmable capacitor banks 606 and 608 can be included at the inputs to LNTA 610 to tune receiver input 640 match to a desired input frequency.

In some embodiments, LNTA 610 is a noise-cancelling common-gate (CG), common-source (CS) low-noise transconductance amplifier formed from components as illustrated in FIG. 6.

During operation in accordance with some embodiments, a transmitter replica signal is provided in canceller inputs 636 and 638, and a transmitter local oscillator is provided to transmitter local oscillator inputs 632 and 634. Canceller filters 602 and 604 then provide a cancellation signal to a node 641 between receiver input 640 and LNTA 610.

LNTA 610 then amplifies a signal which is a combination of the signals output by filters 602 and 604 and the signal received at receiver input 640.

LNTA 640 then produces output signals that are provided to mixers 612 via DC blocking capacitors 611 and 613. Mixers 612 then mix the output signals with local oscillator (LO) signals from local oscillator generator 626. Mixers 612 can be any suitable mixers in some embodiments. For example, mixers 612 can be two four-phase, current-driven mixers in some embodiments. In some embodiments, any suitable number of phases can be mixed by mixers 612. For example, eight phases can be mixed, instead of four, to provide a better noise figure, in some embodiments. As shown, when implemented with four phases, the LO generator can generate the LO signals as four 25% non-overlapping LO signals based on a reference LO signal received at receiver LO inputs 642.

The outputs of mixer 612 can then be provided to second-order Rauch transimpedance amplifiers (TIAs) 614, 616, 618, and 620. The outputs from the Rauch TIAs can be provided to programmable recombination circuitry 622 to combine the receiver outputs for noise and cross-modulation distortion cancellation.

As shown, circuitry 622 can include four sub-circuits 680, 682, 684, and 686. Sub-circuit 680 is connected to the outputs of Rauch TIA 614, sub-circuit 682 is connected to the outputs of Rauch TIA 616, sub-circuit 684 is connected to the outputs of Rauch TIA 618, and sub-circuit 686 is connected to the outputs of Rauch TIA 620. Within each of these sub-circuits, there is sub-sub-circuit for the I channel and the Q channel. Within each of these sub-sub-circuits, five (or any other suitable number) binary weighted selectable transconductors can be provided to weight the output of the corresponding Rauch TIA in a corresponding one of the outputs 644 and 646. For example, for Rauch TIA 614, one or more of the transconductors labelled 1x, . . . , 16x in the I channel in sub-sub-circuit 680 can be selected and the selected transconductors can determine the contribution of Rauch TIA 614 to output 644. Likewise, as another example, for Rauch TIA 614, one or more of the transconductors labelled 1x, . . . , 16x in the Q channel in sub-sub-circuit 680 can be selected and the selected transconductors can determine the contribution of Rauch TIA 614 to output 646.

The outputs of the Q sub-sub-circuits of circuitry 622 can be connected to outputs 646. Similarly, the outputs of the I sub-circuits of circuitry 622 can be connected to outputs 644.

Global biasing circuitry 628 may be provided, as known in the art, to generate biasing circuits in circuit 600 in accordance with some embodiments.

ESD and power clamp circuitry 630 may be provided, as known in the art, to protect circuit 600 from electrostatic discharge and over-voltage conditions in accordance with some embodiments.

Level shifter, series-to-parallel-interface SPI circuitry 624 may be provided to program the entire receiver through a single series interface in accordance with some embodiments. Series control signals may be connected to inputs 624 in accordance with some embodiments.

Figure 7:
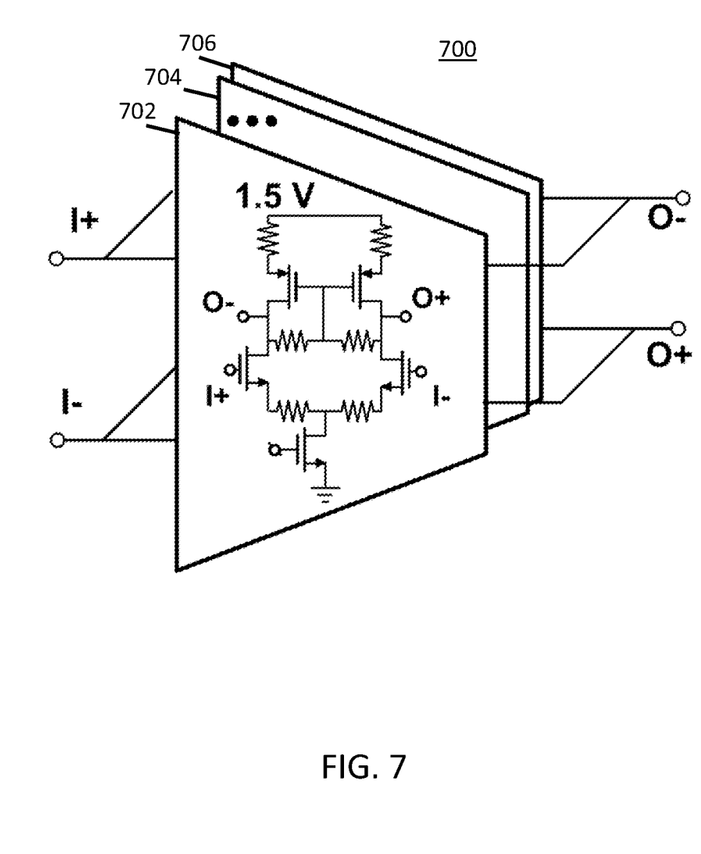
FIG. 7 is a schematic of an example of transconductor $G_m$ bank in accordance with some embodiments.

FIG. 7 illustrates an example 700 of a schematic of a transconductor $G_m$ cell that can be used for transconductors 302, 304, 306, and/or 308 of FIG. 3 in accordance with some embodiments. As shown, each cell 700 can be formed from multiple transconductors 702, 704, and 706 that are connected in parallel and that can be turned-on or turned-off to provide a controllable transconductance. Any suitable number of transconductors, each with any suitable transconductance, can be provided in a cell in some embodiments.

In some embodiments, the $G_m$ cells of the canceller filters can be source-degenerated and operate under slightly higher supply voltage (e.g., 1.5 V) than the rest of the receiver (e.g., 1.2 V). In addition, the on-resistance ($R_{on}$) of the N-path switches can be designed to be much smaller than $R_{TX}$ and $R_{RX}$ (e.g., 3.3Ω), so that its impact on overall canceller linearity is minimized.

The $G_m$ cells can use a channel length of 200 nm to lower flicker noise in some embodiments.

Figure 8:
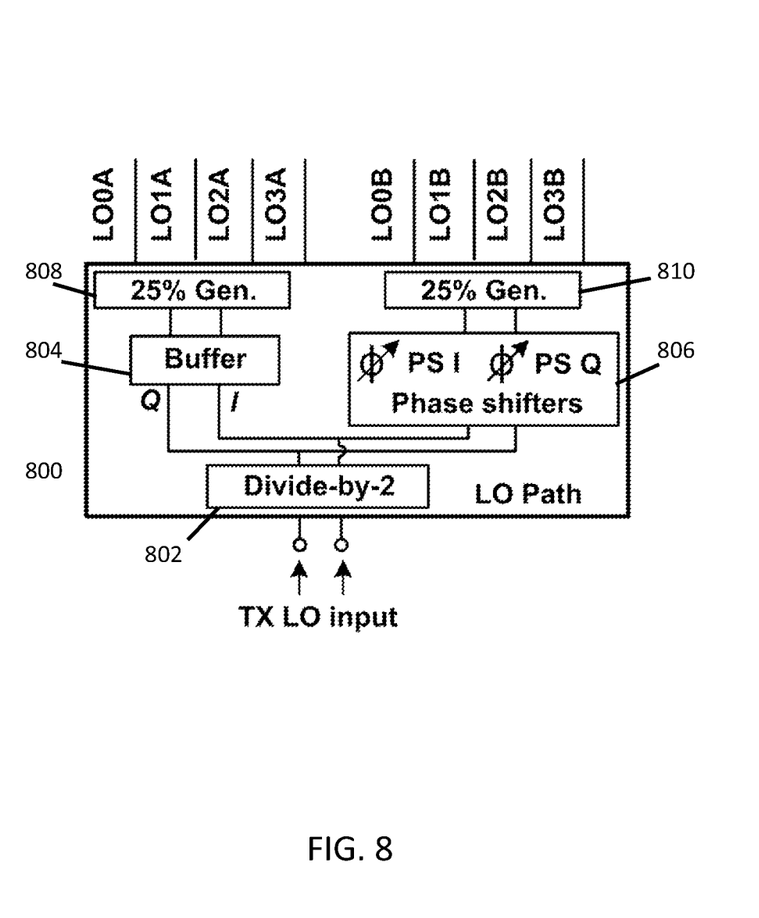
FIG. 8 is a schematic of an example of local oscillator generator in accordance with some embodiments.

As shown in FIGS. 3 and 4, in some embodiments, switches 318, 320, 322, 324, 326, 328, 330, and 332 of each filter can be controlled by local oscillator signals LO0A, LO1A, LO2A, LO3A, LO0B, LO1B, LO2B, and LO3B, respectively, for that filter. These local oscillator signals can appear as shown in timing diagrams 418 and 420 of FIG. 4, and can be generated in any suitable manner, in some embodiments. For example, in some embodiments, these local oscillator signals can be generated using a circuit 800 as shown in FIG. 8. An instance of circuit 800 can be connected between each of inputs 632 and 634 and switches 318, 320, 322, 324, 326, 328, 330, and 332 of filters 602 and 604, respectively.

As illustrated, circuit 800 includes a divide-by-2 quadrature divider 802, LO slew-rate-control filters 804, I/Q vector-interpolation phase shifters 806, and 25% duty-cycle generators 808 and 810. LO slew-rate-control filters 804 attenuate the harmonics to maximize the linearity of the subsequent vector interpolators.

Figure 9:
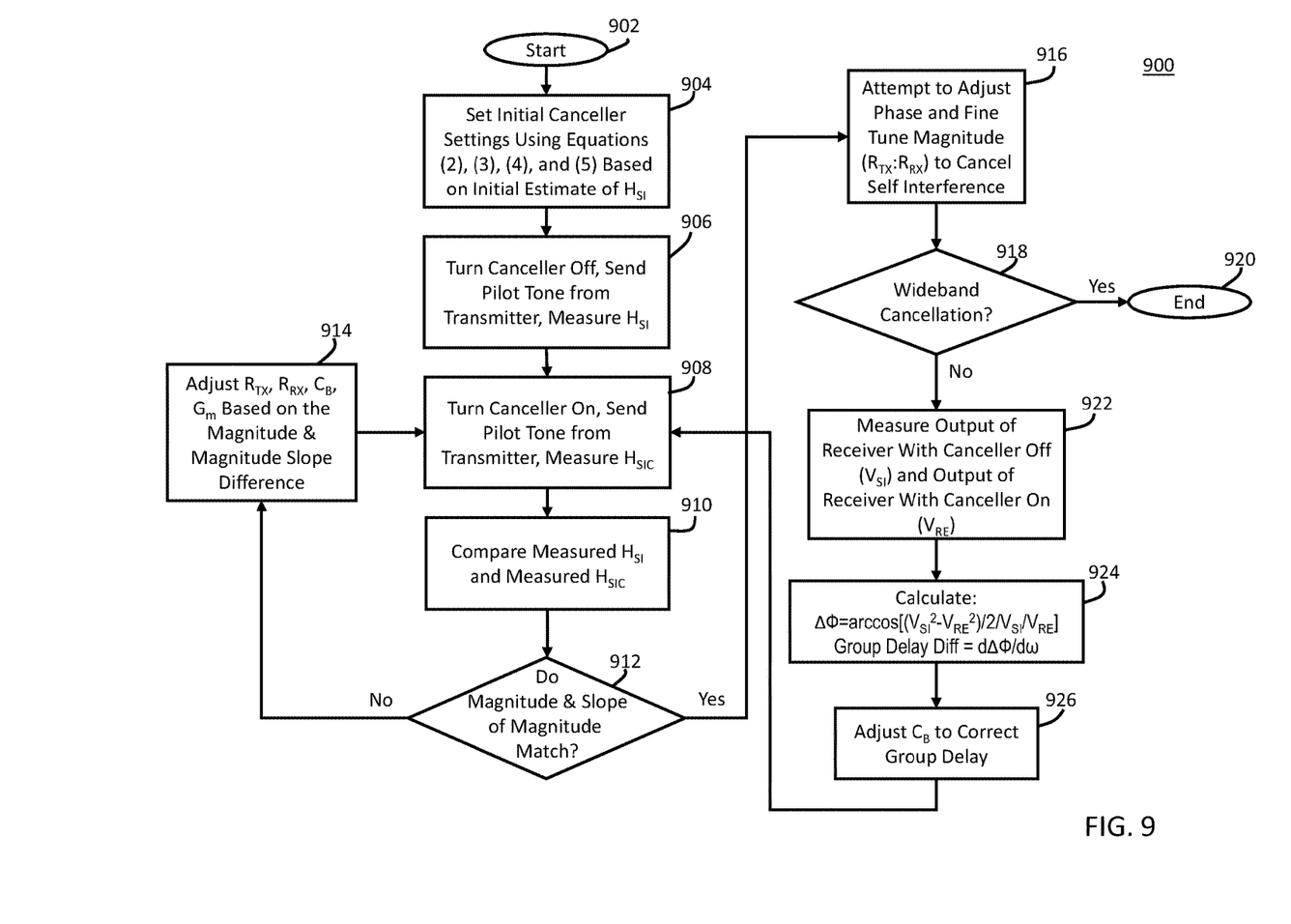
FIG. 9 is a flowchart of an example of a calibration process in accordance with some embodiments.

An example 900 of a process for setting the values of $R_{TX}$, $R_{RX}$, $C_B$, and $G_m$ in each filter i is shown in FIG. 9 in accordance with some embodiments. As illustrated, after process 900 begins at 902, the process can set initial canceller settings for $A_i$, $\phi_i$, $Q_i$ and $\omega_i$ based on an an estimate of antenna isolation interference $H_{SI}$ for the given antenna configuration using equations (2), (3), (4), and (5). The estimated $H_{SI}$ can be obtained from simulation or initial measurement results.

Next, at 906, process 900 can turn-off the canceller (e.g., by closing switch 346 of FIG. 3), send a pilot tone from the transmitter, and measure actual antenna isolation interference $H_{SI}$ based on known performance characteristics of the transmitter and receiver.

Then, at 908, process 900 can turn-on the canceller (e.g., by opening switch 346 of FIG. 3), send a pilot tone from the transmitter, and measure antenna isolation interference after cancellation $H_{SIC}$.

Process 900 can then compare $H_{SI}$ and $H_{SIC}$ at 910, and determine if the magnitude and slope of magnitude of $H_{SI}$ and $H_{SIC}$ match at 912. If not, process 900 can branch to 914, at which it can adjust the values of $R_{TX}$, $R_{RX}$, $C_B$, and $G_m$ based on the magnitude and slope of magnitude difference, and then loop back to 908.

Otherwise, at 912, process 900 can branch to 916 at which it can attempt to adjust phase and fine tune the magnitude to cancel the self-interference. The phase can be adjusted by changing the ΔT between the local oscillators controlling the filter switches, in some embodiments. The magnitude can be adjusted by changing $R_{TX}$ relative to $R_{RX}$, in some embodiments.

At 918, process can determine if wideband cancellation has been achieved. If so, process can end at 920.

Otherwise, process can proceed to 922 at which it can transmit pilot tones and measure the output of the receiver with the canceller turned-off ($V_{SI}$) and the output of the receiver with the canceller turned on ($V_{RE}$). Then, at 924, process 900 can determine the group delay difference using the equations shown in the figure. Based on the group delay difference, process 900 can then adjust $C_B$ to correct the group delay and loop back to 908.

In some embodiments, process 900 can be performed under the control of a hardware processor (which can be a microprocessor, a digital signal processor, a controller, etc.) that is executing instructions that correspond to process 900. Any suitable computer readable media can be used for storing these instructions. For example, in some embodiments, computer readable media can be transitory or non-transitory. For example, non-transitory computer readable media can include media such as magnetic media (such as hard disks, floppy disks, etc.), optical media (such as compact discs, digital video discs, Blu-ray discs, etc.), semiconductor media (such as random access memory (RAM), flash memory, electrically programmable read only memory (EPROM), electrically erasable programmable read only memory (EEPROM), etc.), any suitable media that is not fleeting or devoid of any semblance of permanence during transmission, and/or any suitable tangible media. As another example, transitory computer readable media can include signals on networks, in wires, conductors, optical fibers, circuits, any suitable media that is fleeting and devoid of any semblance of permanence during transmission, and/or any suitable intangible media.

In some embodiments of the disclosed subject matter, the above described steps of the process of FIG. 9 can be executed or performed in any order or sequence not limited to the order and sequence shown and described in the figure. Also, some of the above steps of the process of FIG. 9 can be executed or performed substantially simultaneously where appropriate or in parallel to reduce latency and processing times. Furthermore, it should be noted that FIG. 9 is provided as an example only. At least some of the steps shown in this figure may be performed in a different order than represented, performed concurrently, or omitted.

In some embodiments, the canceller filters can be designed to have a digitally controlled peak group delay that ranges from 1 to 28 ns, a frequency shift that ranges from −10 MHz to +10 MHz under the peak group delay setting, full 360° phase shift range, and an attenuation range from 20 to 40 dB including the −10 dB receiver-side capacitive coupling.

The provision of the examples described herein (as well as clauses phrased as "such as," "e.g.," "including," and the like) should not be interpreted as limiting the claimed subject matter to the specific examples; rather, the examples are intended to illustrate only some of many possible aspects.

Although the invention has been described and illustrated in the foregoing illustrative embodiments, it is understood that the present disclosure has been made only by way of example, and the numerous changes in the details of implementation of the invention can be made without departing from the spirit and scope of the invention, which is only limited by the claims which follow. Features of the disclosed embodiments can be combined and rearranged in various ways.

What is claimed is:

1. A circuit for a transceiver self-interference canceller, comprising:
    a plurality of radio frequency high-quality factor (RF high-Q) bandpass filters that each emulate the magnitude, phase, magnitude slope, and phase slope responses of antenna isolation in different sub-frequency bands, that are each coupled to a transmitter signal, and that collectively produce a self-interference cancellation signal, wherein each of the plurality of RF high-Q bandpass filters comprises:
        a first variable resistance having a control input, a first side coupled to the transmitter signal, and a second side;
        a plurality of first switches, each having a control input, a first side coupled to the second side of the variable resistor, and a second side;
        a plurality of first variable capacitances, each having a control input, a first side connected to ground, and a second side connected to a unique one of the second sides of the plurality of first switches;
        a plurality of second switches, each having a control input, a first side coupled to a unique one of the second sides of the plurality of first variable capacitances, and a second side;
        a second variable resistance having a control input, a first side connected to ground, and a second side coupled to each of the second sides of the plurality of second switches;
        a second variable capacitance having a control input, a first side connected to the each of the second sides of the plurality of second switches, and a second side coupled to a receiver signal;
        a plurality of variable transconductors, each having an input connected to a unique one of the second sides of the plurality of first variable capacitances, and an output connected to a unique one of the second sides of the plurality of first variable capacitances, wherein for each of the plurality of variable transconductors, the input of the variable transconductor is not connected to the output of the variable transconductor; and
        a first local oscillator having a plurality of outputs each connected to a unique one of the control inputs of the plurality of first switches, wherein the first local oscillator turns on one of the plurality of first switches at a time; and
        a second local oscillator having a plurality of outputs each connected to a unique one of the control inputs of the plurality of second switches, wherein the second local oscillator turns on one of the plurality of second switches at a time, and wherein the plurality of outputs of the second local oscillator are shifted in time by a time shift amount from the plurality of outputs of the first local oscillator.

2. The circuit of claim 1, wherein the first variable resistance includes a plurality of switched resistors.

3. The circuit of claim 1, wherein the plurality of first variable capacitances each include a plurality of switched capacitors.

4. The circuit of claim 1, wherein the plurality of second switches are each a transistor.

5. The circuit of claim 1, wherein the second variable resistance includes a plurality of switched resistors.

6. The circuit of claim 1, wherein the second variable capacitance includes a plurality of switched capacitors.

7. The circuit of claim 1, wherein the plurality of variable transconductors each includes a bank of switched transconductors.

8. The circuit of claim 1, wherein each of the first local oscillator and the second local oscillator is a 25% duty-cycle local oscillator.

* * * * *